United States Patent

Lin et al.

[11] Patent Number: 5,913,123
[45] Date of Patent: Jun. 15, 1999

[54] MANUFACTURING METHOD FOR DEEP-SUBMICRON P-TYPE METAL-OXIDE SEMICONDUCTOR SHALLOW JUNCTION

[75] Inventors: Horng-Chih Lin; Jien-Sheng Chao; Liang-Po Chen, all of Hsinchu, Taiwan

[73] Assignee: National Science Council, Taipei, Taiwan

[21] Appl. No.: 08/912,524

[22] Filed: Aug. 18, 1997

[30] Foreign Application Priority Data

Aug. 26, 1996 [TW] Taiwan .................................. 85110378

[51] Int. Cl.[6] .......................... H01L 21/336; H01L 21/22
[52] U.S. Cl. .......................... 438/299; 438/301; 438/307; 438/558
[58] Field of Search .................................. 438/299, 301, 438/305, 306, 307, 530, 532, 558, 564, FOR 320, FOR 322; 148/DIG. 59

[56] References Cited

U.S. PATENT DOCUMENTS

| | | | |
|---|---|---|---|
| 4,640,721 | 2/1987 | Uehara et al. | 438/564 |
| 5,281,552 | 1/1994 | King et al. | 438/564 |
| 5,407,847 | 4/1995 | Hayden et al. | 438/564 |
| 5,443,994 | 8/1995 | Solheim | 437/164 |
| 5,500,391 | 3/1996 | Bevk et al. | 438/442 |
| 5,521,108 | 5/1996 | Rostoker et al. | 438/260 |
| 5,668,027 | 9/1997 | Hashimoto | 438/558 |

FOREIGN PATENT DOCUMENTS 4-08-213605  8/1996  Japan .

*Primary Examiner*—Michael Trinh
*Attorney, Agent, or Firm*—Smith, Gambrell & Russell, LLP; Beveridge, DeGrandi, Weilacher & Young Intellectual Property Group

[57] ABSTRACT

A method for manufacturing a deep-submicron P-type metal-oxide semiconductor shallow junction utilizes an electron terminal structure with a base covered by a layer containing boron, germanium, and silicon. This layer containing boron, germanium, and silicon ("B—Ge—Si") is used as a shield during ion implanting and as an impurity ion source to form a high diffusion ion concentration at a shallow junction of the semiconductor base or substrate. The B—Ge—Si layer can be thoroughly removed using selective corrosive erosion. Due to the simplicity of this invention's manufacturing process, it can be used for deep-submicron PMOS component production, and thus, it has great practical value.

8 Claims, 7 Drawing Sheets

MANUFACTURING METHOD FOR DEEP-SUBMICRON P-TYPE METAL-OXIDE SEMICONDUCTOR SHALLOW JUNCTION

BACKGROUND OF THE INVENTION

1. Field of the Invention

This invention concerns the manufacture of a high-precision semiconductor printed circuit; in particular, it pertains to a manufacturing method for producing a deep-submicron P-type metal-oxide semiconductor (PMOS) transistor component.

2. Description of the Prior Art

In high-precision semiconductor printing circuits, especially for those produced by so-called deep-submicron technology, various issues generated during the downsizing of the component structure must be carefully examined. For example, due to the reduction in length of the passage area of the metal-oxide semiconductor, possible short channel effects must be considered. As a result, in order to complement the manufacture of smaller and more intricate semiconductors, various new technologies have been proposed.

The aforementioned short channel metal-oxide semiconductor components will be used as an example for further explanation. In short channel metal-oxide semiconductor components, problems pertaining to reliability that are most likely to occur include short channel effects. In particular, the thermoelectric effect may be improved by adjusting the structure of the diffusing area of the source pole and the supply pole, and much pertinent technology has been proposed for this purpose. To counteract the short channel effect, the primary method is to reduce the diffusing area's junction, i.e. using the shallow junction technology. However, with the continuous downsizing of component dimensions, in terms of the domain of deep-submicron technology, using traditional particle distribution planting methods to form a shallow junction is seemingly difficult. Especially, with respect to P-type metal-oxide semiconductor components, as the impurity diffusing area is formed by synthesizing with lighter-weight ions, such as boron ions, it is not easy to regulate the depth of diffusion within the tolerable range.

According to the above explanation, the manufacture of a PMOS component's shallow junction is indeed vital technology for controlling the component's reliability. Therefore, many pertinent technologies have been proposed to seek ways of improvement. For example, U.S. Pat. No. 5,443,994 describes a system that uses spacers, containing boron, as a diffusion source. FIG. 1 and FIG. 2 of the present application are sectional diagrams of the primary technique. A gate structure 12 is formed on the base plate or substrate 10, and boron synthesizing germanium (BSG) is used as the gate's side-wall spacer 14, as depicted in FIG. 1. This step is followed by distribution planting P-type conductive style impurity ions into the substrate 10, thereby forming a deep impurity diffusing source pole/drain pole $P^+$ diffusing area 16. As shown in FIG. 2, a heating process is conducted to force the impurity contained in the side-wall spacer 14 to diffuse into the substrate 10, forming an extended diffusing area 18.

However, in the aforementioned manufacturing process, because the side wall spacer 14 is formed by a corrosion method, the thickness control is not sufficiently precise. This means it is not possible to control effectively the range of the extended diffusion area in the above-mentioned manufacturing method. As a result, the state of the impurity distribution in the transistor passage area will contain a large amount of variation, and this may harm the consistency of the component operating unit's characteristics. Furthermore, as the impurity diffuses directly into the substrate 10 via ion distributing planting, it may cause the depth of the $P^+$ diffusing area 16 to be too deep, easily resulting in problems, such as punch-through, for the component, which also discredits its reliability.

SUMMARY OF THE INVENTION

Therefore, this invention relates to a new deep-submicron PMOS component manufacturing method which ensures that the component's shallow junction condition is totally controlled in order to improve the component's operating characteristics and reliability.

In addition, this invention's deep-submicron PMOS component manufacturing method is simple, and it has a self-aligning function, which complements the current manufacturing technique to achieve its practical purpose.

Furthermore, this invention's deep-submicron PMOS component manufacturing method does not require the use of a plasma etching method to process the side-wall spacer, thus it reduces the damage caused by plasma etching.

To facilitate easy understanding of the aims, characteristics and advantages of this invention, as mentioned earlier, a more practical example is provided below, which will be explained in more detail with the attached drawings.

BRIEF DESCRIPTION OF THE DRAWINGS AND TABLE

Table 1 describes the thickness consumed per minute (in nm) for various corrosion etching methods.

FIG. 1 and FIG. 2 are sectional diagrams showing a traditional 1 PMOS component shallow junction manufacturing method; an FIG. 3 to FIG. 7 are sectional diagrams of a practical example of the method according to this invention for manufacturing a PMOS component.

Reference Numbers Used In The Attached Drawings

10 . . . substrate
12 . . . gate structure
14 . . . side wall spacer
16 . . . $P^+$ diffusing areas
18 . . . extended diffusing area
30 . . . semiconductor substrate
31 . . . silicon dioxide layer
32 . . . gate
34 . . . boron, germanium and silicon (B—Ge—Si) containing layer
36 . . . diffusing area
38 . . . extended diffusing area

DETAILED DESCRIPTION OF THE INVENTION

Figure 1:
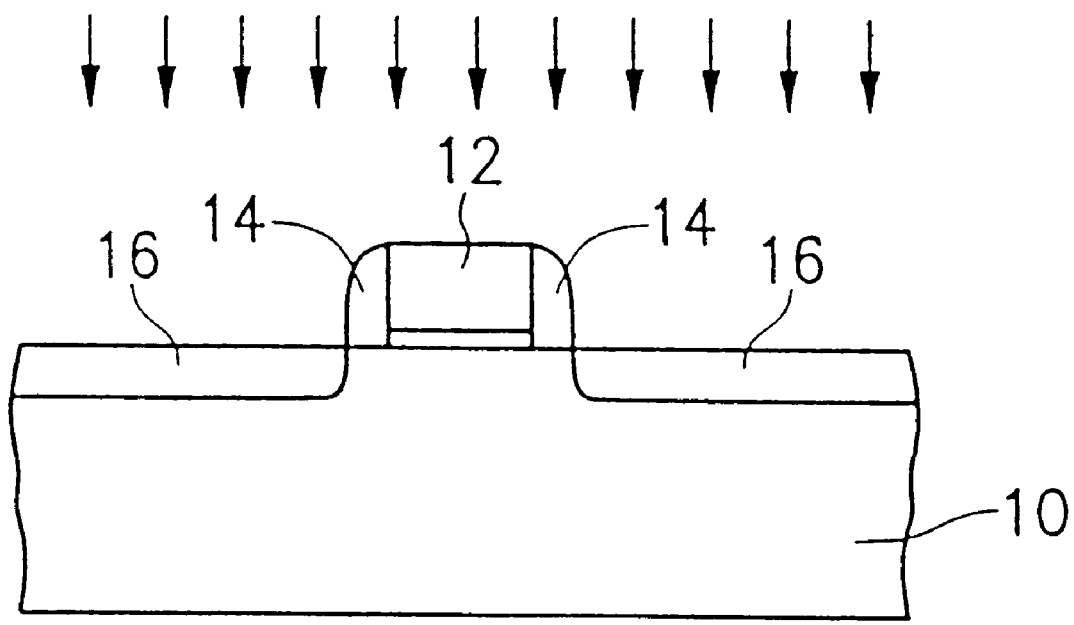
Figure 2:
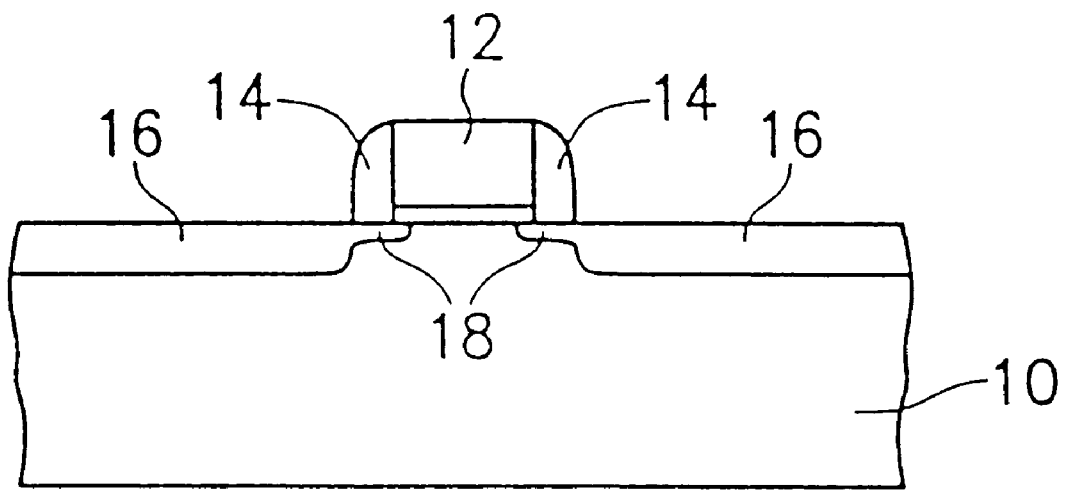

The invention includes "a method for manufacturing a deep-submicron P-type metal-oxide semiconductor shallow junction" that utilizes an electron terminal structure with a base covered by a layer containing boron, germanium, and silicon. This layer containing boron, germanium, silicon is used as a shield to conduct ion distribution implanting and as an impurity diffusing source to form a high diffusing concentration of the shallow junction in the substrate. This layer containing boron—germanium—silicon (B—Ge—Si) can be thoroughly removed using selective erosion.

The manufacturing method for producing a deep-submicron P-type metal-oxide semiconductor shallow junction that is suitable for use on a semiconductor substrate includes:

forming a gate structure on top of a semiconductor substrate;

forming a layer containing boron, germanium and silicon on top of the semiconductor substrate, wherein this layer covers the gate structure;

adding an impurity into the layer containing boron, germanium and silicon and the semiconductor substrate, wherein the impurity containing area forms a source diffusion area and a drain diffusion area in the semiconductor substrate;

heating the layer containing boron, germanium and silicon so that the impurity within diffuses into the semiconductor substrate to form an extended diffusion area; and selectively corrosive etching to remove the layer which contains boron, germanium and silicon.

In particular, the layer containing boron, germanium and silicon shall contain at least one percent of boron or one percent of germanium. The selective corrosion etching is done using a solvent that contains acetic acid ($CH_3COOH$), nitric acid ($HNO_3$), and hydrogen fluoride (HF).

The source diffusion area and the drain diffusion area are formed by implanting boron ions. The layer containing boron, germanium and silicon is heated in two phases, including furnace heating in the first phase and rapid thermal annealing (RTA) in the second phase. The gate structure contains a synthesized crystal-silicon gate. The layer containing boron, germanium and silicon is formed by a deposition method.

A more practical example of the deep-submicron PMOS component manufacturing method according to this invention includes the following steps: (a) forming a gate/electrode on top of a semiconductor substrate; (b) forming a layer, containing boron—germanium—silicon (B—Ge—Si), on top of the aforementioned gate/electrode and semiconductor substrate; (c) mixing an impurity into the aforementioned layer, containing boron, germanium and silicon, and the semiconductor substrate, to thereby form a source diffusion area and a drain diffusing area in the semiconductor substrate; (d) heating the above-mentioned layer containing boron, germanium and silicon, to allow the impurity to diffuse into the semiconductor substrate, thus forming an extended diffusing area; and (e) selectively corrosive etching to remove the layer containing silicon, germanium and boron.

IMPLEMENTED EXAMPLE

Figure 3:
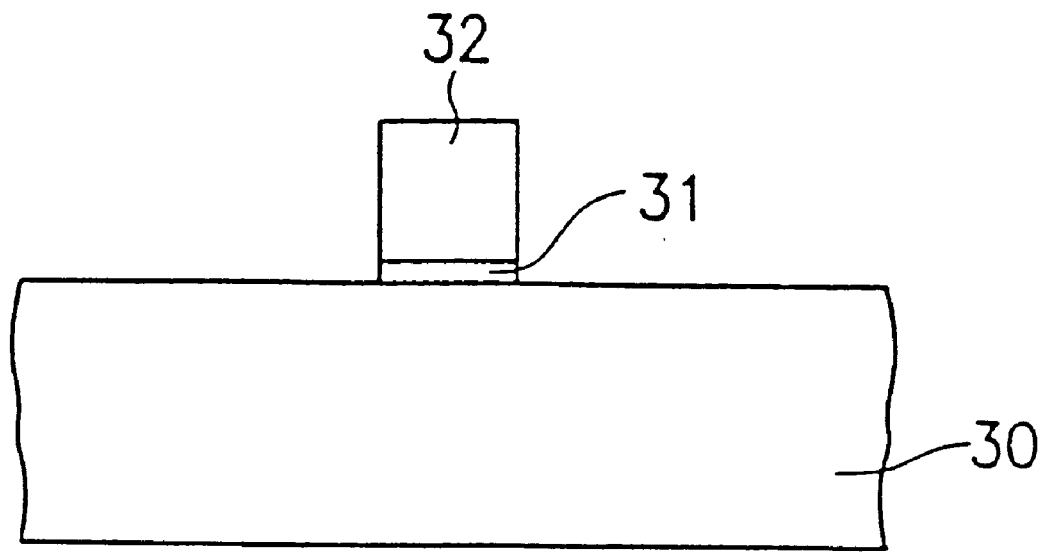

Please refer to FIG. 3. This PMOS component manufacturing method is suitable for use on a semiconductor substrate 30. The semiconductor substrate 30 may be a general n-type silicon substrate, an n-type grid section, or an n-type conductive epitaxial layer. A gate structure 32 is constructed on the substrate 30, which can be a synthesized polycrystalline silicon gate, wherein the gate 32 and the substrate 30 are separated by a silicon dioxide layer 31. There are other components and areas on the substrate 30, but they are not directly related to this invention, and thus no further illustration or text explanation will be provided. The polycrystalline silicon gate 32 is formed after a layer of synthesized polycrystalline-silicon has been deposited, and a pattern is defined and etched. As this process is familiar to professionals in this trade, further description will be omitted herein.

Figure 4:
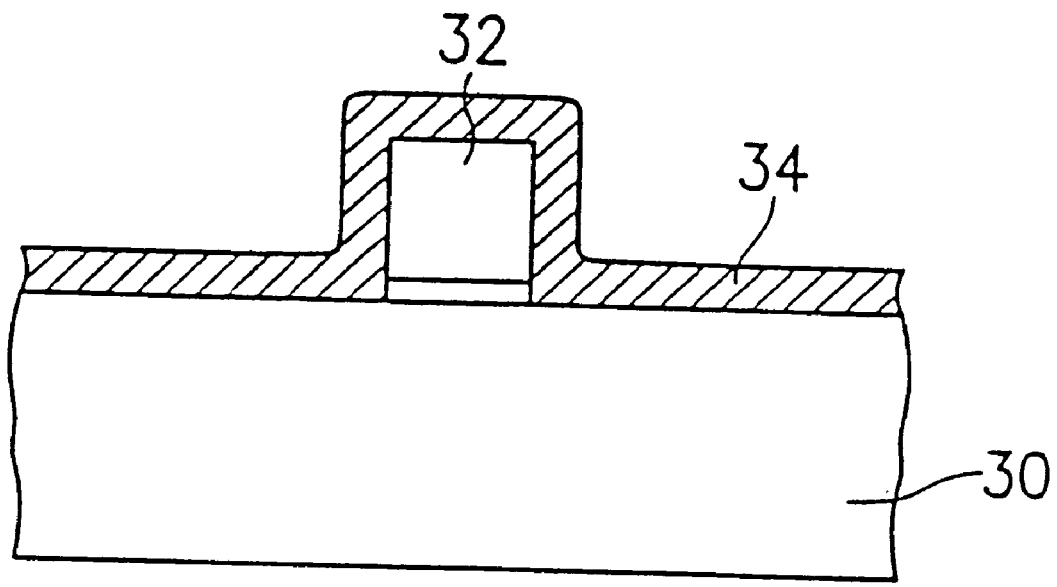

Next, please refer to FIG. 4. A layer containing boron, germanium and silicon (B:Ge:Si) 34 is formed on the substrate 30, and it covers the gate structure 32 completely. This layer 34, containing boron-germanium-silicon, may be formed utilizing a chemical vapor deposition method (CVD), such as a low pressure chemical vapor deposition method (LPCVD). For this method, the germanium and boron contents should be preferably above one percent. Moreover, in order to complement the actual dimensions of the current deep-submicron technology, the thickness of boron—germanium—silicon layer 34 may be maintained between 500 Å and 1000 Å. Naturally, with variations in the component dimensions and structure, the thickness of the layer containing silicon, germanium and boron should also be adjusted accordingly; this invention does not restrict it specifically.

Figure 5:
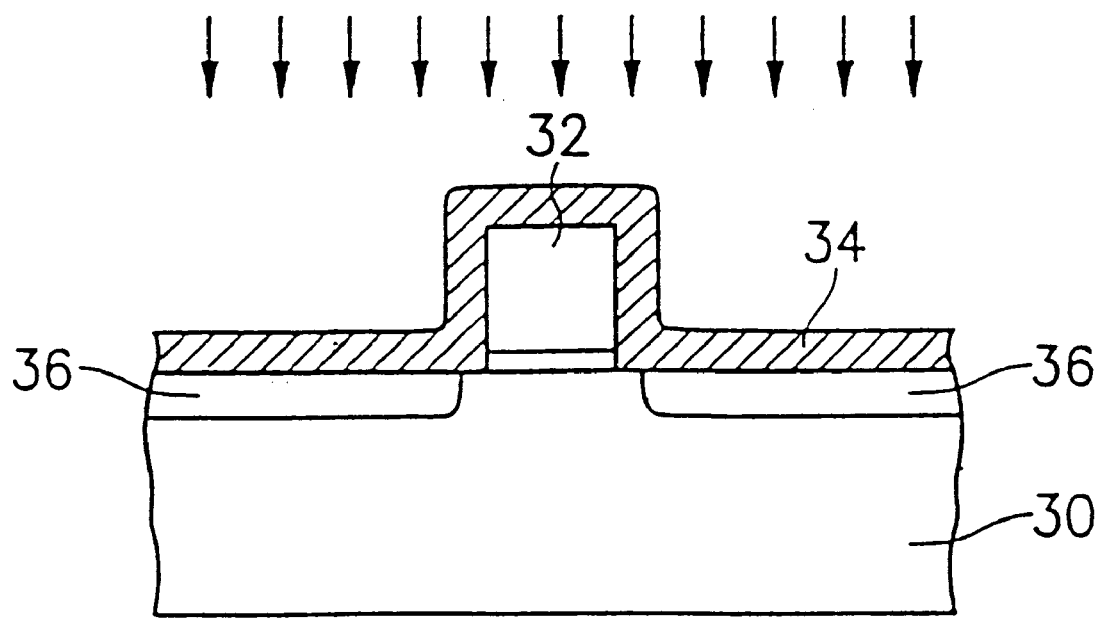

After the boron—germanium—silicon (B—Ge—Si) layer 34 has been formed, an ion distribution implanting procedure is performed by dissolving a P-type impurity into the layer containing boron, germanium and silicon 34 and the substrate 30. As illustrated in FIG. 5, owing to shielding by the layer containing boron, germanium and silicon 34, the depth of the impurity planted into the substrate 30 will be shallower, thus forming a shallow junction's $P^+$ source diffusion area and drain diffusion area 36. According to this more practical example, if boron ions or $BF_2^+$ is used in distribution implanting, its energy should preferably be between 20 to 50 Kev, and a preferable quantity mixed in should be approximately $1\times10^{15}$ to $5\times10^{15}/cm^2$.

Figure 6:
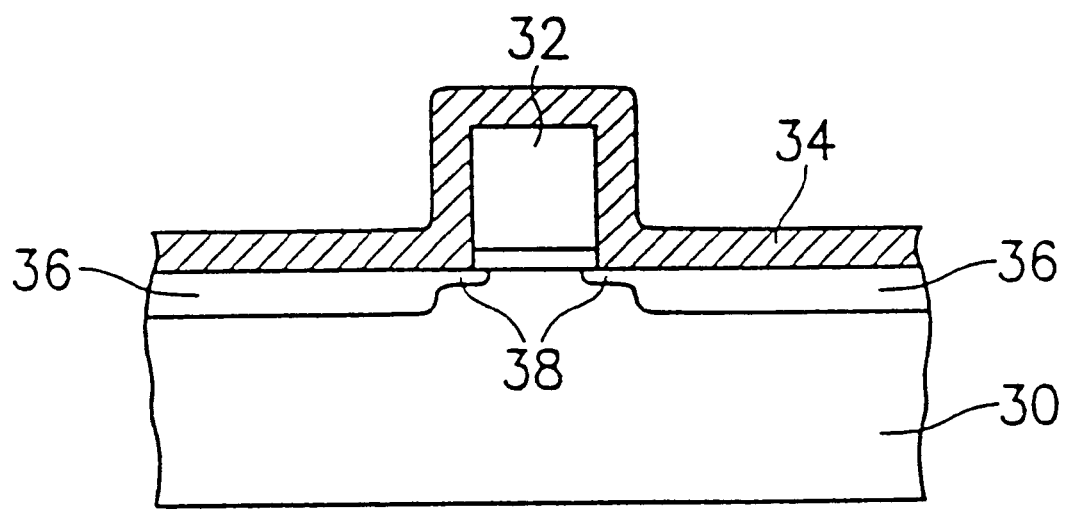

The impurity diffused layer containing boron, germanium and silicon 34 shall be processed with heat to allow its boron content to diffuse into the substrate 30 as illustrated in FIG. 6 to form an extended diffusion area 38. As the thickness of the layer containing boron, germanium and silicon may be accurately controlled during the chemical vapor deposition process, using it as the diffusing source for the extended diffusion area will effectively define the limits of impurity distribution, which is beneficial to the consistency of the component structure and its characteristics. Also, according to this more practical example, a two-phase method can be used in the heating process required for impurity diffusion, which method includes a lower temperature furnace heating in the first phase and a rapid thermal annealing (RTA) action in the second phase. The first-phase furnace heating shall be conducted at approximately 800° C. for about 20 minutes, and in the second-phase rapid thermal annealing (RTA) action, a temperature of approximately 1050° C. may be used for heating between 10 to 20 seconds.

When the shallow junction diffusing areas, i.e. $P^+$ diffusion area 36 and the extended diffusion area 38, have been formed, the layer containing boron, germanium and silicon 34, which has been used as a diffusing source, can be removed. As the selectivity for a combined solution of acetic acid ($CH_3COOH$), nitric acid ($HNO_3$), and hydrogen fluoride (HF) as the solvent is quite good, it may be used to remove the layer containing boron, germanium and silicon rapidly. This may be done without much corrosion to the silicon or oxidized silicon material, thus it can achieve the selective etching effect of effectively removing the layer containing boron, germanium and silicon without compromising the component's structure. The table below indicates the different compositions of acetic acid, nitric acid, hydrogen fluorine acid and plasma used to separately corrode and determine the corrosion rate for non-diffused synthesized poly-crystalline silicon, diffused synthesized crystalline silicon, non-diffused germanium silicon, diffused boron germanium and oxidized silicon. Among these, corrosive etching method (I) uses a wet corrosion method with a solution of $CH_3COOH: HNO_3: HF=33:26:1$, corrosive etching method (II) uses a wet type corrosion method with a solution of $CH_3COOH: HNO_3: HF=100:40:2$ as the solvent, and corrosive etching method (III) is a plasma etching method which utilizes $CF_4$ and $O_2$ gases. The units used for the corrosion rate displayed the Table 1 are based on the thickness consumed per minute (nm).

Figure 7:
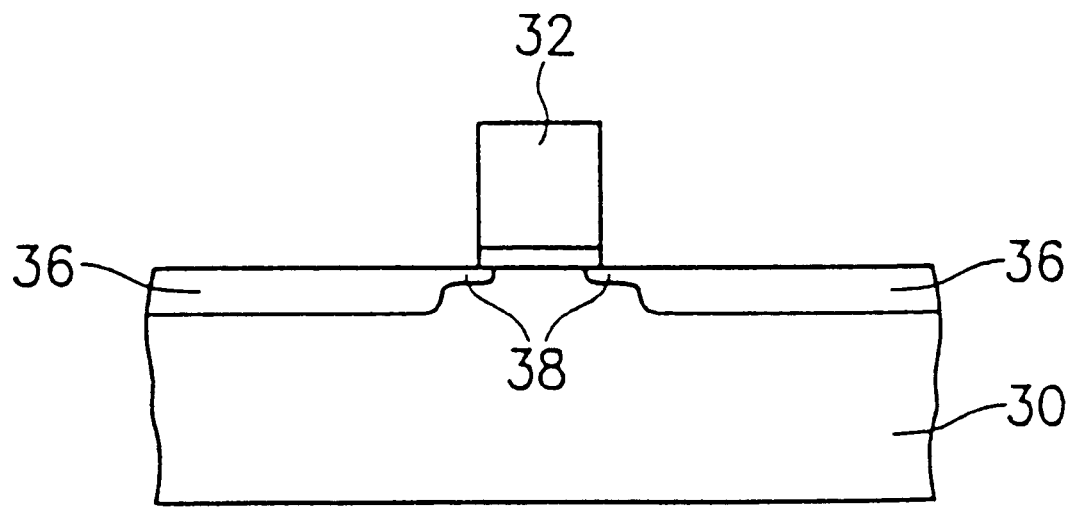

According to the results listed in the above table, it can be observed that selectivity may be maximized by using a combined solution-wet type-two etch procedure to remove the layer containing boron, germanium and silicon, and it is far better than the effect of a traditional plasma etching method. The component structure after the corrosive etching process is completed is shown in FIG. 7. It may be further processed by other traditional manufacturing processes so as to form the required component structure designated.

According to the above description, this invention's manufacturing method has the following advantages:

1. It achieves the effect of high-concentration mix for the shallow junction.
2. It is equipped with a self-aligning process.
3. It does not require plasma etching, thereby reducing the damages caused by plasma.
4. The length of the diffusion area can be accurately controlled by the thickness of the layer containing boron, germanium and silicon.
5. It is a simple manufacturing process which is more suitable for a deep-submicron manufacturing process.

Although this invention has been disclosed in a more practical example above, this example is not to be used to limit this invention. Professionals who are familiar with this technique may apply certain modifications and enhancements without deviating from this invention's essence and limit. Therefore, the scope of protection for this invention is based on the claims described below.

TABLE 1

The units used in this Table for the corrosion rate are the thickness consumed per minute (nm).

| | Corrosive etching method (I) | Corrosive etching method (II) | Corrosive etching method (III) |
|---|---|---|---|
| Intrinsic polycrystalline silicon | 150–200 | ≦50 | 50–60 |
| Boron-doped polycrystalline silicon (Boron content should be higher than $10^{20}/cm^3$) | 12–15 | ≦50 | 50–60 |
| Intrinsic polycrystalline silicon-germanium ($Si_{1-x}Ge_x$, X > 0.1) | >1200 | X | X |
| Intrinsic polycrystalline silicon-germanium ($Si_{1-x}Ge_x$, X > 0.1, Boron > $10^{20}/cm^3$) | >1200 | ~450 | 50–60 |// 
| Oxidized silicon | ~10 | ≦5 | ≦5 |
| Boron-doped cystalline silicon (Boron > $10^{20}/cm^3$) | <10 | <5 | 50~60 |

TABLE 1-continued

The units used in this Table for the corrosion rate are the thickness consumed per minute (nm).

What is claimed is:

1. A method for manufacturing a deep-submicron P-type metal-oxide semiconductor shallow junction on a semiconductor substrate, comprising:

forming a gate structure on a portion of a surface of the semiconductor substrate;

forming a layer containing boron, germanium, and silicon on the surface of the semiconductor substrate and covering the gate structure;

implanting an impurity into the layer containing boron, germanium, and silicon and the semiconductor substrate, to thereby form a source diffusion area and a drain diffusion area in the semiconductor substrate;

heating the layer containing boron, germanium, and silicon to thereby cause boron in the layer to diffuse into the semiconductor substrate to form an extended diffusion area; and selectively corrosive etching to remove the layer containing boron, germanium, and silicon.

2. The method as claimed in claim 1, wherein the layer containing boron, germanium, and silicon contains at least one percent boron.

3. The method as claimed in claim 1, wherein the layer containing boron, germanium, and silicon contains at least one percent germanium.

4. The method as claimed in claim 1, wherein the etching includes use of a solvent which contains acetic acid, nitric acid, and hydrogen fluoride.

5. The method as claimed in claim 1, wherein the source diffusion area and the drain diffusion area are formed by implanting boron ions.

6. The method as claimed in claim 1, wherein the heating of the layer containing boron, germanium, and silicon is performed in two phases including a first phase and a second phase, wherein the first phase includes furnace heating and the second phase includes rapid thermal annealing.

7. The method as claimed in claim 1, wherein the gate structure is formed from polycrystalline-silicon.

8. The method as claimed in claim 1, wherein the layer containing boron, germanium, and silicon is formed by a deposition method.

* * * * *